US010128134B2

(12) United States Patent
Kondoh (10) Patent No.: US 10,128,134 B2
(45) Date of Patent: Nov. 13, 2018

(54) SUBSTRATE TRANSFER METHOD AND PROCESSING SYSTEM

(71) Applicant: TOKYO ELECTRON LIMITED, Tokyo (JP)

(72) Inventor: Keisuke Kondoh, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/512,244

(22) PCT Filed: Sep. 7, 2015

(86) PCT No.: PCT/JP2015/075344
§ 371 (c)(1),
(2) Date: Mar. 17, 2017

(87) PCT Pub. No.: WO2016/043083
PCT Pub. Date: Mar. 24, 2016

(65) Prior Publication Data
US 2017/0287746 A1 Oct. 5, 2017

(30) Foreign Application Priority Data
Sep. 19, 2014 (JP) .................................. 2014-191649

(51) Int. Cl.
*H01L 21/67* (2006.01)
*H01L 21/677* (2006.01)
*H01L 21/687* (2006.01)

(52) U.S. Cl.
CPC .. *H01L 21/67103* (2013.01); *H01L 21/67167* (2013.01); *H01L 21/67703* (2013.01); *H01L 21/67745* (2013.01); *H01L 21/68707* (2013.01)

(58) Field of Classification Search
CPC ......... H01L 21/67207; H01L 21/67196; H01L 21/67201; H01L 51/56; H01L 21/67742;
(Continued)

(56) References Cited

U.S. PATENT DOCUMENTS 9,263,307 B2* 2/2016 Kim .................. H01L 21/67201
9,728,431 B2* 8/2017 Ohashi .............. H01L 21/67196
(Continued)

FOREIGN PATENT DOCUMENTS

| JP | 2004-119635 | 4/2004 |
| JP | 2006-190894 | 7/2006 |
| JP | 2013-161799 | 8/2013 |

OTHER PUBLICATIONS

International Search Report dated Nov. 17, 2015.

*Primary Examiner* — Gregory A Wilson (57) ABSTRACT

Provided is a substrate transfer method for sequentially transferring a substrate between a heat treatment chamber and another chamber different from the heat treatment chamber using a transfer unit having a first pick and a second pick. An unprocessed substrate is held by the first pick, and the substrate is transferred to the heat treatment chamber. A processed substrate, heat-treated in the heat treatment chamber, is held by the second pick, and the unprocessed substrate held by the first pick is loaded into the heat treatment chamber. The processed substrate held by the second pick is transferred to the other chamber. An unprocessed substrate in the other chamber is held by the first pick, the processed substrate held by the second pick is loaded into the other chamber, and then both the first pick and the second pick are put into a state of not holding a substrate.

6 Claims, 7 Drawing Sheets

(58) Field of Classification Search
CPC ......... H01L 21/02428; H01L 21/67098; H01L 21/67167; H01L 21/67184; H01L 21/67736; H01L 21/68771; C23C 14/566; C23C 14/568; C23C 14/5806
See application file for complete search history.

(56) References Cited

U.S. PATENT DOCUMENTS

| | | | |
|---|---|---|---|
| 2006/0021575 A1 | 2/2006 | Ishizawa et al. | |
| 2006/0155412 A1 | 7/2006 | Ikeda | |
| 2008/0274288 A1* | 11/2008 | Kondo | C23C 16/4408 427/294 |
| 2015/0063957 A1* | 3/2015 | Olgado | C23C 16/54 414/226.05 |
| 2016/0293459 A1* | 10/2016 | Cha | H01L 21/67161 |
| 2017/0198391 A1* | 7/2017 | Ashihara | C23C 16/4412 |

* cited by examiner

SUBSTRATE TRANSFER METHOD AND PROCESSING SYSTEM

CROSS-REFERENCE TO RELATED APPLICATIONS

This application is a National Stage Application of, and claims priority to, PCT Application No. PCT/JP2015/075344, filed on Sep. 7, 2015, entitled "SUBSTRATE TRANSFER METHOD AND PROCESSING SYSTEM," which claims priority to Japanese Patent Application No. 2014-191649, filed on Sep. 19, 2014. The foregoing patent applications are herein incorporated by reference by entirety for all purposes.

FIELD OF THE INVENTION

The present invention relates to a substrate transfer method and a processing system.

BACKGROUND OF THE INVENTION

There is known a semiconductor device manufacturing process for forming a thin film having a multilayer structure on a wafer by sequentially performing various thin film processes (e.g., film formation, modification, heat treatment, etching and the like) on a semiconductor wafer (hereinafter, referred to as "wafer").

Such semiconductor devices manufacturing process can be realized by a processing system having a cluster structure in which a plurality of processes can be consecutively performed by connecting a plurality of processing chambers to a single common transfer chamber. There is suggested a transfer method for sequentially transferring a wafer to processing chambers in the processing system configured as described above (see, e.g., Patent Document 1).

In order to consecutively and effectively perform desired processes in the processing chambers, it is preferable to effectively transfer the wafer. Therefore, in the above processing system, a transfer robot having two arms may be used to effectively transfer a plurality of wafers. Each of the two arms of the transfer robot is provided with a pick for holding a wafer. One pick holds and transfers an unprocessed wafer to a processing chamber. The other pick holds and transfers a processed wafer that has been subjected to a predetermined process in the transfer chamber to a next processing chamber. By holding a wafer on each of the two picks of the transfer robot, the wafer can be transferred more effectively compared to the case of using a transfer robot having one arm.

Patent Document 1: Japanese Patent Application Publication No. 2004-119635

However, a processed wafer unloaded from a heat treatment chamber for performing heat treatment on a wafer has a high temperature. Therefore, in order to hold the processed wafer unloaded from the heat treatment chamber, the two arms (including the picks) need to be made of a material that can withstand a high temperature.

Especially, when functions of the arms are fixed, the amount of heat applied to one arm is different from the amount of heat applied to the other arm. For example, when one arm has a function of transferring a wafer before processing (hereinafter, referred to as "unprocessed wafer") and the other arm has a function of transferring a wafer after processing (hereinafter, referred to as "processed wafer"), a peak of a temperature of the arm for transferring the processed wafer is higher than that of a temperature of the arm for transferring the unprocessed wafer. As a result, it is difficult to distribute the amount of heat received during the wafer transfer to both arms, and the arm for transferring the processed wafer deteriorates faster than the arm for transferring the unprocessed wafer.

SUMMARY OF THE INVENTION

In view of the above, in one aspect, the present invention is intended to decrease a peak of a temperature of an arm in transferring a substrate.

In accordance with one aspect, there is provided a substrate transfer method for sequentially transferring a substrate between a heat treatment chamber and another chamber different from the heat treatment chamber by using a transfer unit having a first pick and a second pick. In a first process, an unprocessed substrate is held by the first pick and the substrate is transferred to the heat treatment chamber. In a second process, a processed substrate, which has been subjected to heat treatment in the heat treatment chamber, is held by the second pick, the processed substrate is unloaded from the heat treatment chamber, and the unprocessed substrate held by the first pick is loaded into the heat treatment chamber. In a third process, the processed substrate held by the second pick is transferred to said another chamber. In a fourth process, an unprocessed substrate in said another chamber is held by the first pick, the processed substrate held by the second pick is loaded into said another chamber, and then both the first pick and the second pick are put into a state of not holding a substrate.

Effect of the Invention

In accordance with one aspect, the peak of the temperature of the arm in transferring the substrate can be decreased.

DETAILED DESCRIPTION OF THE EMBODIMENTS

Hereinafter, embodiments for implementing the present invention will be described with reference to the accompanying drawings. Like reference numerals will be used for substantially like parts throughout this specification and the drawings, and redundant description thereof will be omitted (Configuration of Processing System)

Figure 1:
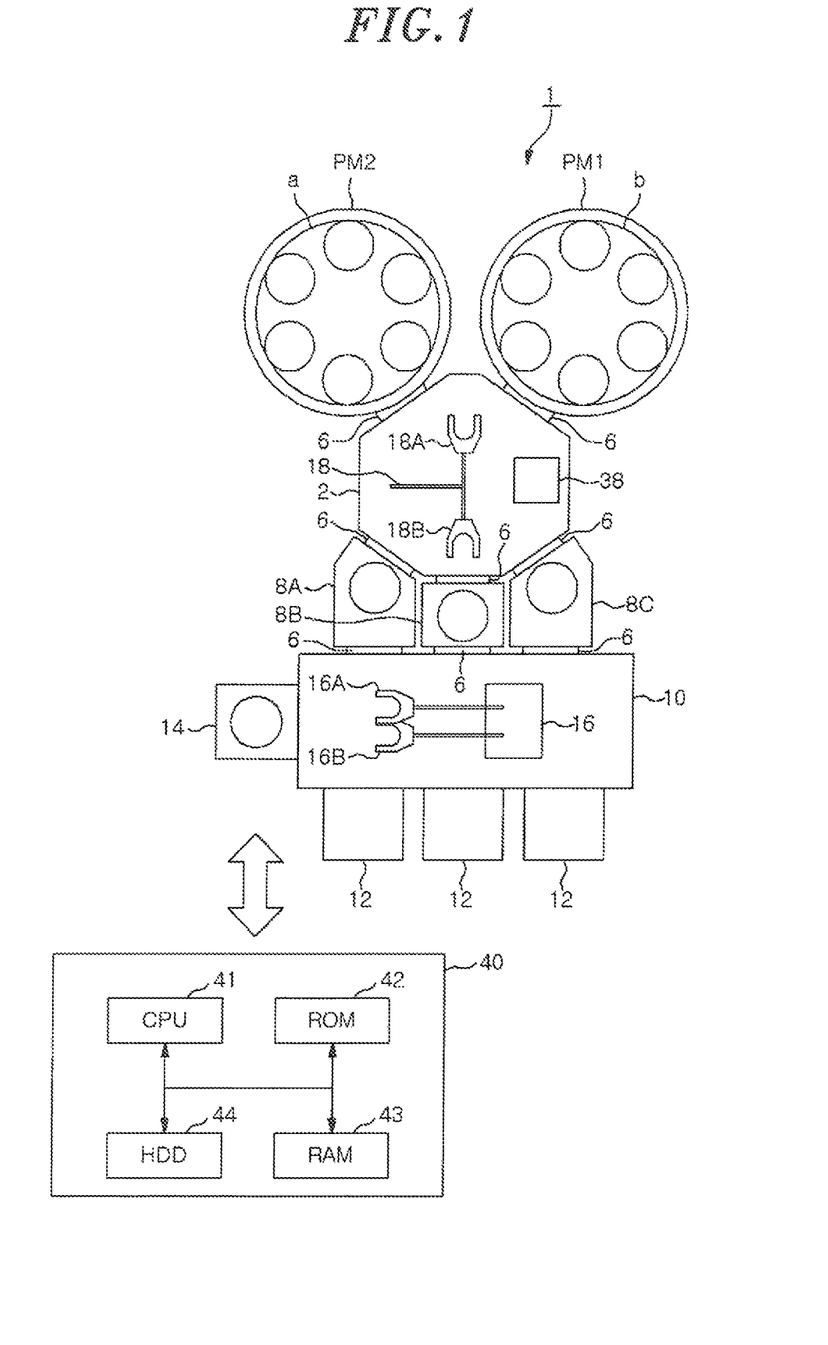
FIG. 1 shows an example of a configuration of a processing system according to an embodiment.

First, an example of a configuration of a processing system 1 according to an embodiment will be described with reference to FIG. 1. As shown in FIG. 1, the processing system 1 of the present embodiment includes heat treatment chambers PM1 and PM2 (hereinafter, collectively referred to as "heat treatment chamber PM").

The heat treatment chambers PM1 and PM2 are semi-batch type process chambers for performing heat treatment on six wafers at the same time. In each of the heat treatment chambers PM1 and PM2, the heat treatment of, e.g., about 700° C., is performed on six wafers at the same time. The number of wafers processed at the same time in each of the heat treatment chambers PM1 and PM2 is not limited to six, and may be one, or two or more.

In the processing system 1 of the present embodiment, a wafer is transferred between a plurality of processing chambers including the heat treatment chambers PM1 and PM2. The processing chambers of the processing system 1 include the heat treatment chambers PM1 and PM2, load-lock chambers 8A to 8C (hereinafter, collectively referred to as "load-lock chamber 8"), and a common transfer chamber 2. The two evacuable heat treatment chambers PM1 and PM2 are connected to the common transfer chamber 2 having a polygonal shape through gate valves 6. The heat treatment chamber PM1 includes a susceptor b. Six wafers are sequentially loaded into the chamber by rotating the susceptor b. The heat treatment chamber PM2 includes a susceptor a. Six wafers are sequentially loaded into the chamber by rotating the susceptor a. A rectangular loading transfer chamber 10 is connected to the common transfer chamber 2 through the three evacuable load-lock chambers 8A to 8C.

The gate valves 6 are provided between the load-lock chambers 8A to 8C and the common transfer chamber 2 and between the load-lock chambers 8A to 8C and the loading transfer chamber 10. Three inlet ports 12 and an orienter 14 are connected to the loading transfer chamber 10. The inlet ports 12 mount thereon cassettes, each being capable of accommodating therein a plurality of wafers. The orienter 14 performs position alignment by optically obtaining eccentricity by rotating the wafer.

A loading transfer unit 16 is provided in the loading transfer chamber 10. The loading transfer unit 16 has two picks 16A and 16B for holding wafers. The picks 16A and 16B are capable of extending, contracting, rotating, and moving vertically and linearly. A common transfer unit (hereinafter, simply referred to as "transfer unit 18") is provided in the common transfer chamber 2. The transfer unit 18 has two picks 18A and 18B for holding wafers. The picks 18A and 18B are capable of extending, contracting, rotating, and moving vertically and linearly. The three load-lock chambers 8A to 8C are used as loading ports for loading wafers into the common transfer chamber 2 or as unloading ports for unloading wafers from the common transfer chamber 2.

A buffer unit 38 for temporarily holding a wafer is provided in the common transfer chamber 2. For example, the buffer unit 38 is formed by providing a plate-shaped buffer base on an upper end of a vertically movable elevation rod and providing three supporting pins on the buffer base such that a backside of the wafer is supported on upper ends of the three supporting pins. However, the buffer unit 38 may have any other configuration as long as a wafer can be temporarily mounted thereon. The position of the buffer unit 38 is not limited to that shown in FIG. 1. The buffer unit 38 may be located at any other position in the common transfer chamber 2.

A control unit 40 includes a CPU (Central Processing Unit) 41, a ROM (Read Only Memory) 42, a RAM (Random Access Memory) 43, and a HDD (Hard Disk Drive) 44. The control unit 40 controls heat treatment of the wafer in the heat treatment chamber PM and transfer of the wafer between the heat treatment chambers PM1 and PM2 and the load-lock chambers 8A to 8C based on a processing sequence and a transfer sequence set by a recipe stored in the RAM 43 or HDD 44. The functions of the control unit 40 may be realized by using software or hardware or combination of software and hardware.

(Wafer Transfer Method)

Figure 2:
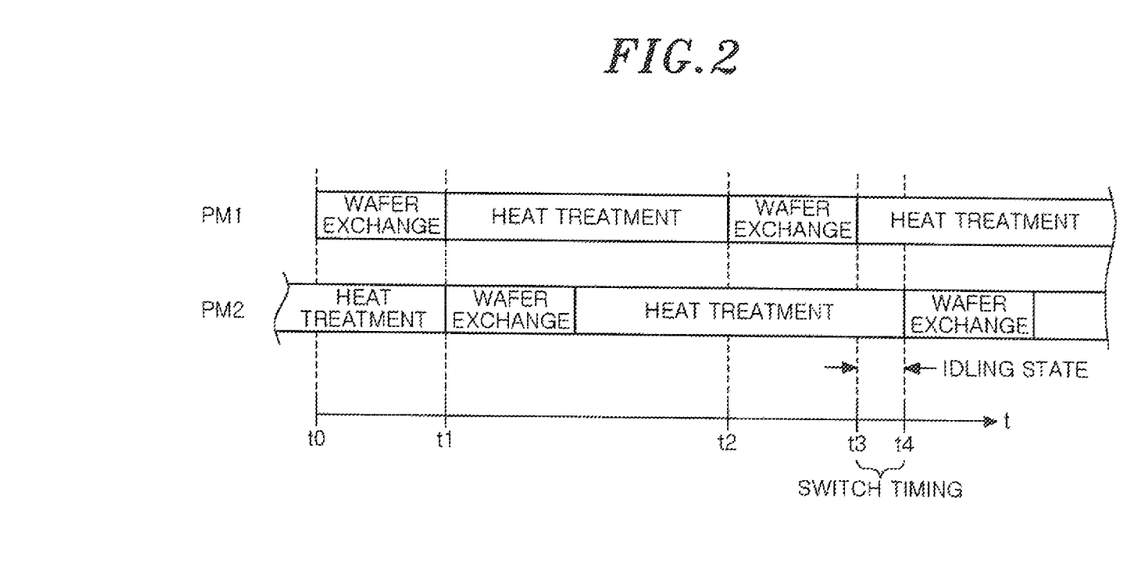
FIG. 2 shows examples of transfer time and processing time of PM1 and PM2 according to an embodiment.
Figure 3A:
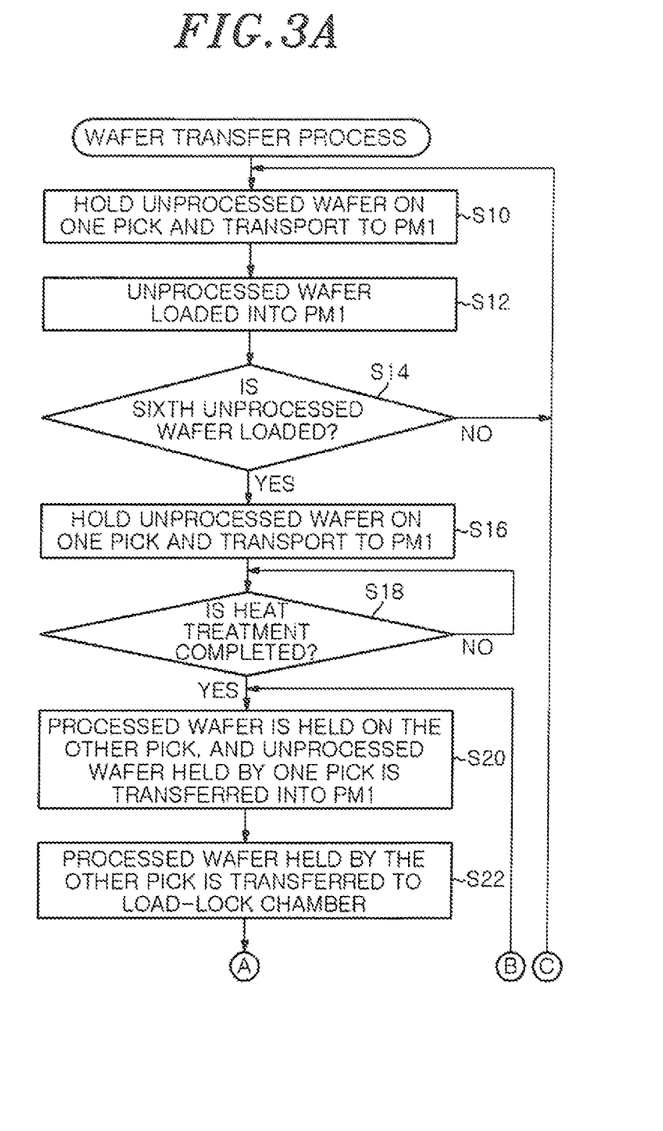
FIGS. 3A and 3B show a flowchart showing an example of a wafer transfer process according to an embodiment.
Figure 3B:
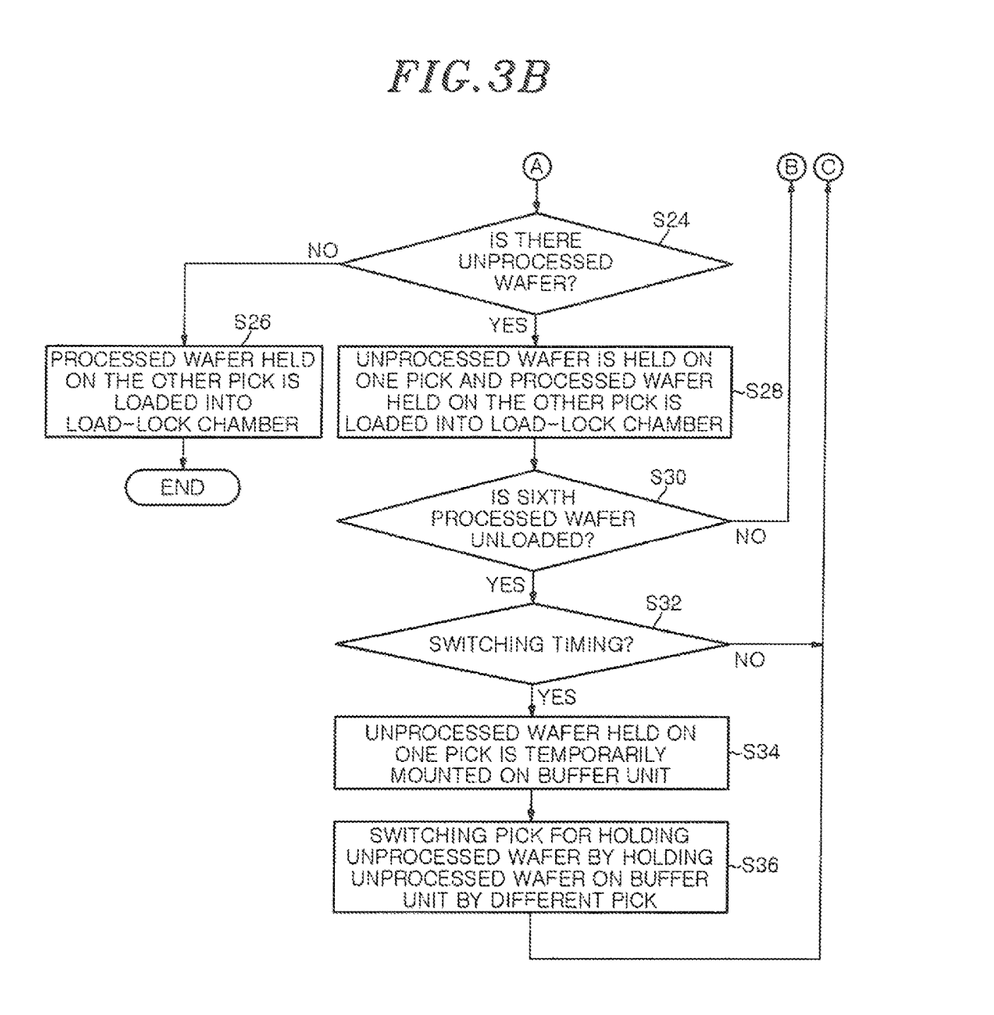

Hereinafter, a method of transferring a wafer in the processing system 1 configured as described above will be described with reference to FIGS. 2, 3 and 4A to 4I. FIG. 2 shows examples of transfer time and processing time of the heat treatment chambers PM1 and PM2 according to an embodiment. FIGS. 3A and 3B show a flowchart showing an example of a wafer transfer process according to an embodiment. FIGS. 4A to 4I explain examples of wafer transfer operations according to an embodiment. The wafer transfer process shown in FIGS. 3A and 3B is controlled mainly by the control unit 40.

Hereinafter, a process of sequentially loading six wafers into the heat treatment chamber PM1, performing heat treatment on the six wafers at the same time, and sequentially unloading the six wafers will be described. Since a process of sequentially loading six wafers into the heat treatment chamber PM2, performing heat treatment on the six wafers at the same time, and sequentially unloading the six wafers is the same as that in the heat treatment chamber PM1, redundant description thereof will be omitted.

As shown in FIG. 2, the heat treatment on wafers is parallelly performed in the two heat treatment chambers PM1 and PM2. Before and after the heat treatment, a wafer exchange process is performed. In the wafer exchange process, processed wafers are unloaded from the heat treatment chambers PM1 and PM2 and unprocessed wafers are loaded into the heat treatment chambers PM1 and PM2.

For example, at time t0 shown in FIG. 2, in the heat treatment chamber PM2, six wafers that have been loaded thereinto are being subjected to the heat treatment. On the other hand, in the heat treatment chamber PM1, at the time t0, the wafer exchange process is started and there is no wafer loaded into the heat treatment chamber PM1.

If the substrate transfer process shown in FIGS. 3A and 3B is started in that state, in a step S10, the control unit 40 controls an unprocessed wafer to be held on one of the picks 16A and 16B and transferred to the heat treatment chamber PM1. The wafer is unloaded from a cassette (including a carrier) mounted on any one of the three loading ports 12. The wafer is held on any one of the picks 16A and 16B in the loading transfer chamber 10 and transferred to any one of the load-lock chambers 8A to 8C.

Figure 4A:
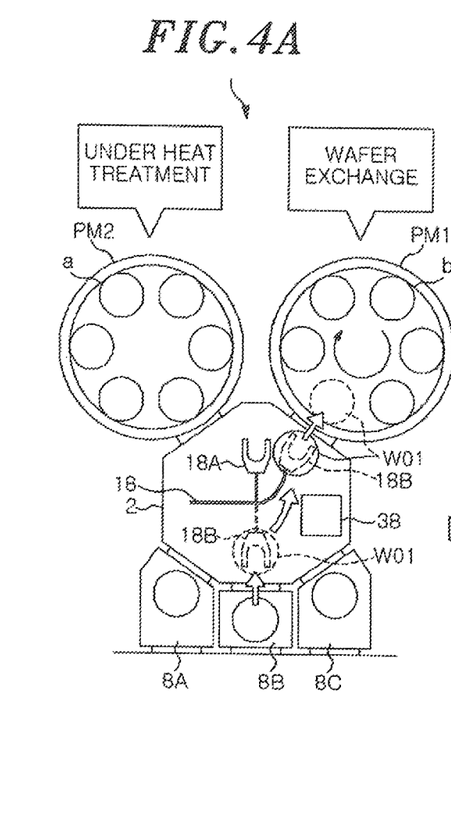
FIGS. 4A to 4I are views for explaining an example of a wafer transfer operation according to an embodiment.

In an example of FIG. 4A, an unprocessed wafer W01 is unloaded from the load-lock chamber 8B among the three load-lock chambers 8A to 8C, held on one pick (pick 18B in this example), and transferred to a vicinity of an inlet of the heat treatment chamber PM1.

Next, in a step S12 of FIG. 3A, the control unit 40 loads the unprocessed wafer into the heat treatment chamber PM1. Accordingly, as shown in the example of FIG. 4A, the unprocessed wafer W01 held on the pick 18B is loaded into the heat treatment chamber PM1 and mounted on the susceptor b.

Then, in a step S14 of FIG. 3A, the control unit 40 determines whether or not the sixth unprocessed wafer has been loaded into the heat treatment chamber PM1. Since only a single unprocessed wafer is loaded into the heat treatment chamber PM1 at that time, the control unit 40 determines that the sixth unprocessed wafer has not been loaded into the heat treatment chamber PM1. The processing returns to the step S10 and a next unprocessed wafer is held on one pick. Then, the steps S10 to S14 are performed.

In the step S14, if the control unit 40 determines that the sixth unprocessed wafer has been loaded into the heat treatment chamber PM1, the processing proceeds to the step S16 so that a next unprocessed wafer is held on one pick and transferred to the vicinity of the inlet of the heat treatment chamber PM1 (example of first process).

Figure 4B:
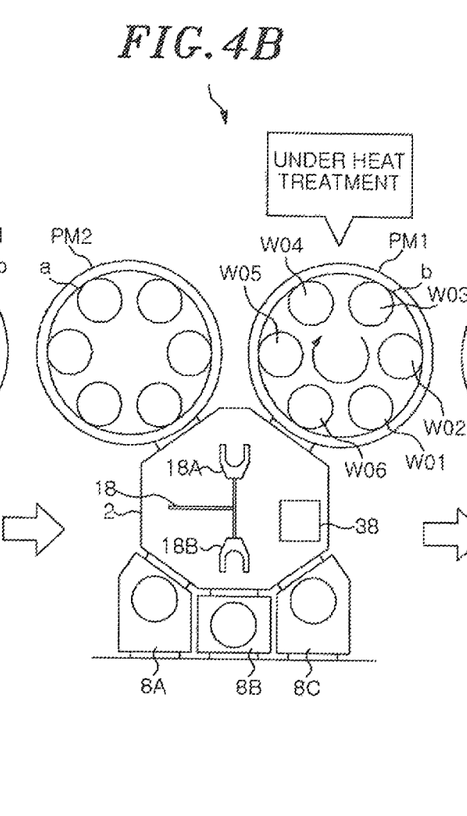

An example of FIG. 4B shows a state in which a first to a sixth unprocessed wafer W01 to W06 are loaded into the heat treatment chamber PM1 and the heat treatment is started in the heat treatment chamber PM1 (time T1 of FIG. 2) and also a state in which a next unprocessed wafer W11 is held on the pick 18B. In the example of FIG. 4B, the unprocessed wafer W11 is unloaded through the load-lock chamber 8B. However, it is not limited thereto, and the unprocessed wafer W11 may be unloaded through the load-lock chamber 8A or 8C.

Figure 4C:
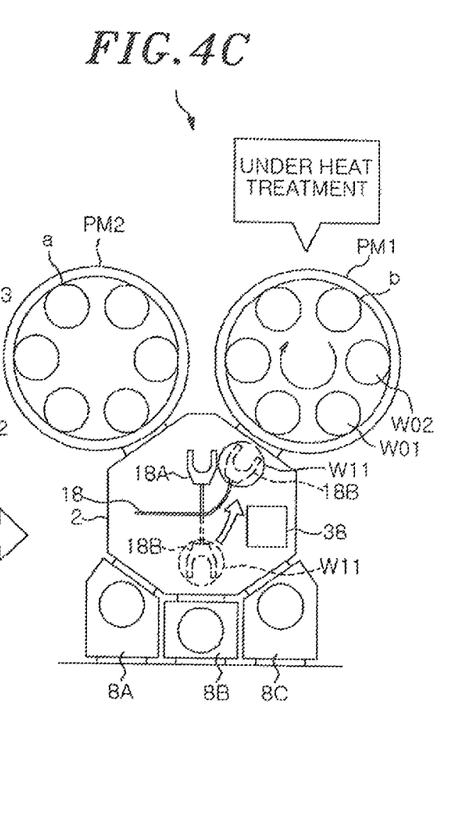
Figure 4D:
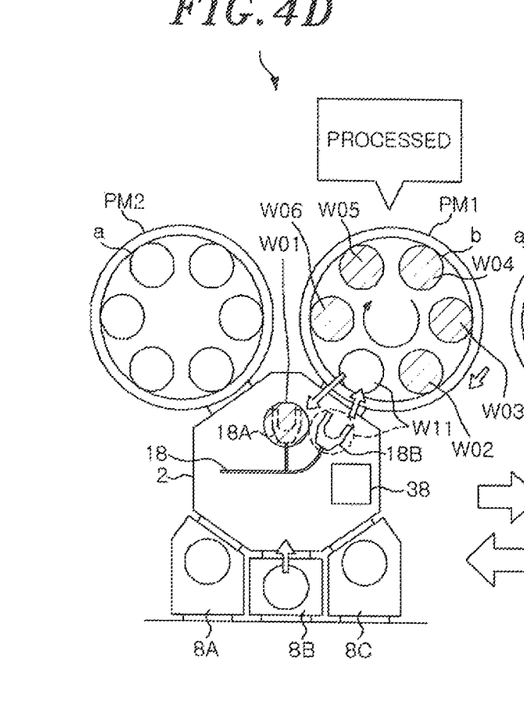

An example of FIG. 4C shows a state in which the unprocessed wafer W11 held on the pick 18B is transferred to the vicinity of the inlet of the heat treatment chamber PM1 while the six wafers W01 to W06 are being subjected to the heat treatment in the heat treatment chamber PM1.

Next, in a step S18 of FIG. 3A, the control unit 40 determines whether or not the heat treatment of the six wafers W01 to W06 is completed. When the control unit 40 determines that the heat treatment of the six wafers W01 to W06 is completed, the processing proceeds to a step S20. In the step S20, the control unit 40 allows the processed wafer that has been subjected to the heat treatment in the heat treatment chamber PM1 to be held on the other pick (pick 18A in this example) and the unprocessed wafer held on the pick 18B to be loaded into the heat treatment chamber PM1 (example of second process). At time T2 of FIG. 2, in the heat treatment chamber PM1, the heat treatment of the wafer is completed and the wafer exchange process is started. In other words, as shown in an example of FIG. 4D, the processed wafer W01 is held on the pick 18A, and the unprocessed wafer W11 held on the pick 18B is loaded into the heat treatment chamber PM1 and mounted on the susceptor b.

Next, in a step S22 of FIG. 3A, the control unit 40 transfers the processed wafer W01 held on the other pick to the load-lock chamber 8 (example of third process).

Next, in a step S24 of FIG. 3B, the control unit 40 determines whether or not an unprocessed wafer to be subjected to the heat treatment is accommodated in the cassette. When the control unit 40 determines that the unprocessed wafer to be subjected to the heat treatment is not accommodated in the cassette, the processing proceeds to a step S26 so that the processed wafer held on the other pick is loaded into the load-lock chamber 8. Then, the present process is completed.

Figure 4E:
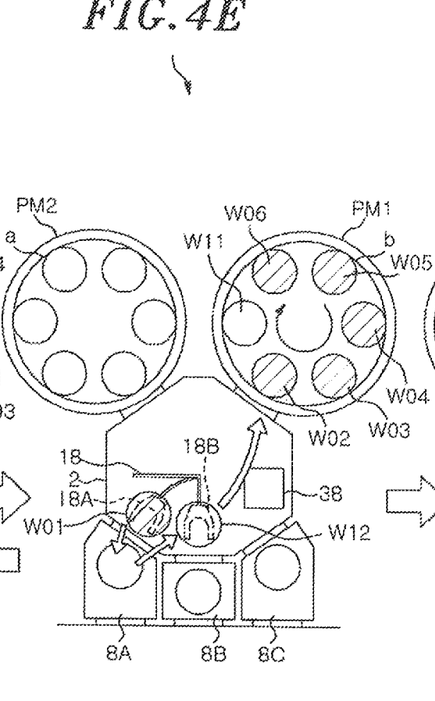
Figure 4F:
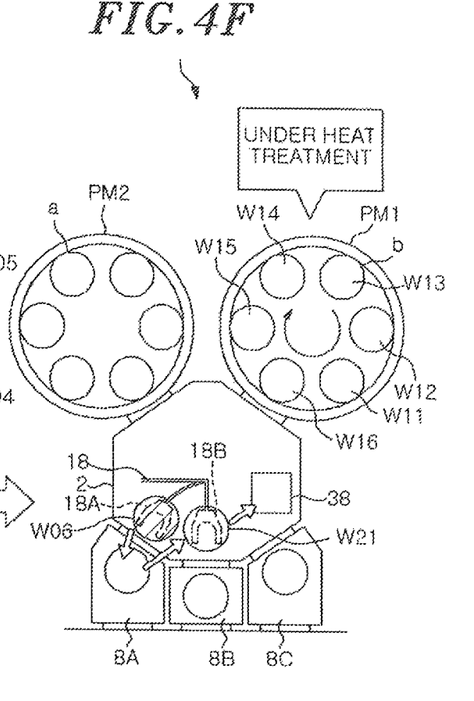
Figure 4G:
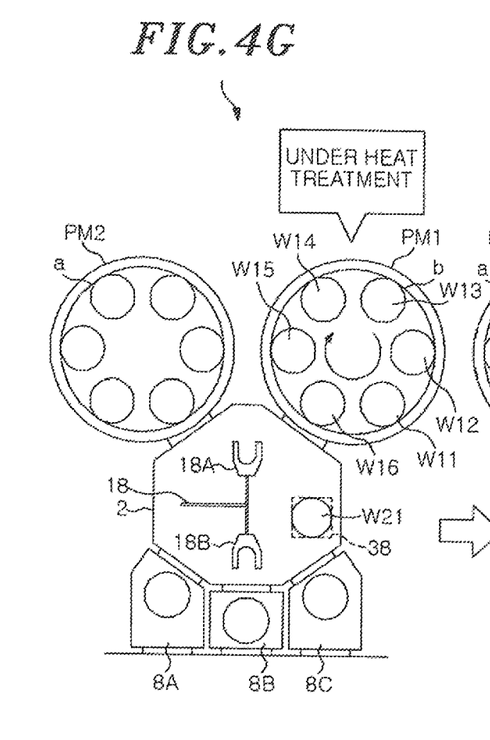

On the other hand, when the control unit 40 determines that the unprocessed wafer to be subjected to the heat treatment exists, the processing proceeds to a step S28 so that the unprocessed wafer is held on one pick, and the processed wafer held on the other pick is loaded into the load-lock chamber 8. An example of FIG. 4E shows a state in which an unprocessed wafer W12 is held on the pick 18B and the processed wafer W01 held on the pick 18A is loaded into the load-lock chamber 8A.

Next, in a step S30 of FIG. 3B, the control unit 40 determines whether or not the sixth processed wafer has been unloaded from the heat treatment chamber PM1. At this moment, only a single processed wafer W01 has been unloaded from the heat treatment chamber PM1. Therefore, the control unit 40 determines that the sixth processed wafer has not been unloaded from the heat treatment chamber PM1. The processing returns to the step S20 and a next processed wafer is held on the other pick. Then, subsequent steps of the step S20 are performed. In this manner, the step S20 to the step S30 are performed until the second to the sixth processed wafer W02 to W06 are unloaded from the heat treatment chamber PM1. Accordingly, the second to the sixth processed wafer W02 to W06 are unloaded from the heat treatment chamber PM1 and loaded into the load-lock chamber 8 one by one. During that period, the processed wafer is held on the pick 18A and the unprocessed wafer is held on the pick 18B.

In the step S30 of FIG. 3B, if the control unit 40 determines that the sixth processed wafer has been unloaded from the heat treatment chamber PM1, the processing proceeds to a step S32 so that the control unit 40 determines whether or not it is time to switch functions of the picks 18A and 18B. In other words, the control unit 40 determines whether or not it is time to switch the functions of the picks such that the processed wafer is held on the pick 18B and the unprocessed wafer is held on the pick 18A.

For example, at time t3 of FIG. 2, in the heat treatment chamber PM1, the wafer exchange process is completed and the heat treatment of the wafer is started. On the other hand, at the time t3, in the heat treatment chamber PM2, other wafers are being subjected to the heat treatment. In other words, during a period from the time t3 to time t4 of FIG. 2, the transfer unit 18 is not used in any of the heat treatment chambers PM1 and PM2. During that period, the transfer unit 18 is in an idling state for waiting for the completion of the heat treatment in the heat treatment chambers PM1 and PM2.

At the time t1 of FIG. 2, in the heat treatment chamber PM1, the wafer exchange process is completed and the heat treatment of the wafer is started. On the other hand, at the time t1, in the heat treatment chamber PM2, the heat treatment of the wafer is completed and the wafer exchange process is started. In other words, at the time t1 of FIG. 2, the transfer unit 18 is not in the idling state.

From the above, it is preferable to perform the process of switching the functions of the picks 18A and 18B which will be described later during the period from the time t3 to the time t4 in which the transfer unit 18 is in the idling state since the transfer efficiency is not decreased. This is because the wafer transfer is not delayed even when the transfer unit 18 is used to switch the functions of the picks 18A and 18B during the period from the time t3 to the time t4.

However, it is not preferable to use the transfer unit 18 to switch the functions of the picks 18A and 18B at the time t1 in which the transfer unit 18 is not in the idling state. This is because the wafer transfer may be delayed.

Therefore, when the transfer unit 18 is not in the idling state, the control unit 40 determines in the step S32 of FIG. 3B that it is not the switching time and the processing returns to the step S10 and the steps S10 to S30 are performed without switching the functions of the picks 18A and 18B. Thus, for next six wafers, unprocessed wafers are transferred by the pick 18B and processed wafers are transferred by the pick 18A.

On the other hand, when the transfer unit 18 is in the idling state, the control unit 40 determines in the step S32 of FIG. 3B that it is the switching time and the processing proceeds to a step 34. In the step 34, the unprocessed wafer held on one pick is temporarily mounted on the buffer unit 38. Accordingly, as shown in an example of FIG. 4F, the unprocessed wafer W21 held on the pick 18B is temporarily mounted on the buffer unit 38. As a consequence, as shown in an example of FIG. 4G, it is possible to put the picks 18A and 18B into a state of not holding the wafer by using the period in which the transfer unit 18 is in the idling state (example of fourth process).

Next, in a step S36 of FIG. 3B, the control unit 40 allows the unprocessed wafer mounted on the buffer unit 38 to be held on a pick different from the pick that has transferred the unprocessed wafer to the buffer unit 38. Accordingly, the functions of the picks are switched such that the unprocessed wafer is held on the pick 18A and the processed wafer is held on the pick 18B.

Figure 4H:
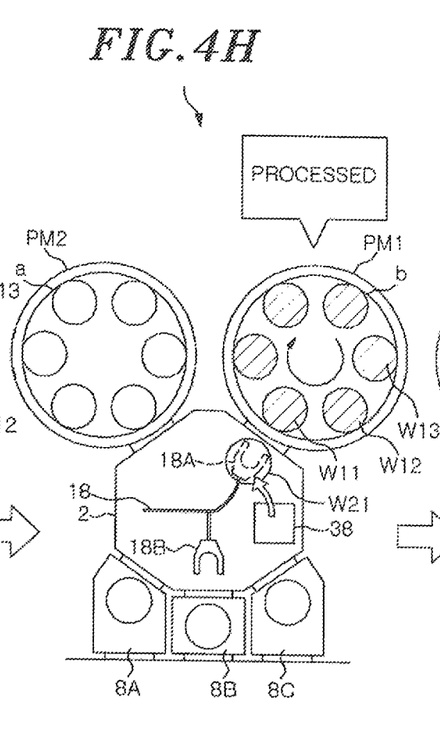
Figure 4I:
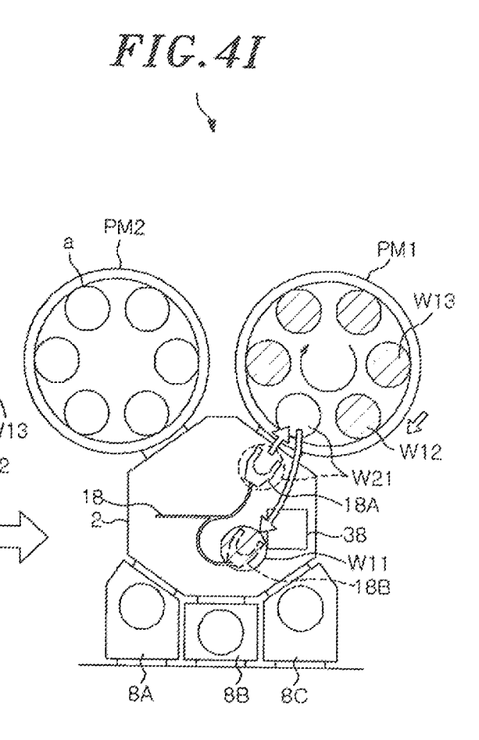

For example, the unprocessed wafer W21 mounted on the buffer unit 38 is held by the pick 18A as shown in an example of FIG. 4H, so that the processed wafer W11 is held by the pick 18B as shown in an example of FIG. 4I. In this manner, the control unit 40 switches the functions of the two picks between transferring an unprocessed wafer and transferring a processed wafer. Then, the processing returns to the step S10 and the subsequent steps of the step S10 are repeated.

The wafer transfer method according to the embodiment has been described. When one of the two arms of the transfer unit 18 transfers an unprocessed wafer and the other arm transfers a processed wafer, the amount of heat applied to the arm for transferring the processed wafer is higher than that applied to the arm for transferring the unprocessed wafer.

Especially, when the wafer is subjected to the heat treatment of a high temperature of, e.g., about 700° C., the processed wafer unloaded from the heat treatment chamber has a considerably high temperature. Thus, when the functions of the arms are fixed, the peak of the temperature of the arm for transferring the processed wafer becomes higher than that of the temperature of the arm for transferring the unprocessed wafer. As a result, heat applied to a pick for holding the wafer is not distributed to both arms, which makes the arm for transferring the processed wafer deteriorate faster than the arm for transferring the unprocessed wafer. Especially, although the two arms of the transfer unit 18 are made of a material that can withstand a high temperature, a component, which is weak to heat, such as a wrist joint bearing or the like, of the arm that transfers a processed wafer and receives a large amount of heat deteriorates first.

Thus, in the wafer transfer method of the present embodiment, the wafer can be transferred without fixing the functions of the two arms of the transfer unit 18. In other words, the arm for transferring an unprocessed wafer and the arm for transferring a processed wafer are switched at predetermined switching timing. Accordingly, the amount of heat received during the transfer can be distributed to the two arms, which enables the peaks of the temperatures of the two arms to be decreased. As a result, it is possible to delay the deterioration of the component of the arm which is weak to heat, such as a wrist joint bearing or the like. In addition, heat resistance levels required for members forming each arm can be lowered. Therefore, the cost of the members forming the arm can be decreased.

In the wafer transfer method of the present embodiment, when the transfer unit 18 is in the idling state, the functions of the two picks 18A and 18B are switched between holding an unprocessed wafer and holding a processed wafer. Accordingly, the functions of the picks 18A and 18B can be switched without delaying the wafer transfer process.

While the substrate transfer method according to the embodiment has been described, the substrate transfer method of the present invention is not limited to the above embodiment and may be variously modified and changed within the scope of the present invention. The contents described in the above embodiments may be combined without contradicting each other.

For example, in the substrate transfer method of the present invention, the timing of switching the functions of the picks between holding an unprocessed wafer and holding a processed wafer is not limited to the idling state of the transfer unit. In other words, the functions of the picks may be switched even when the transfer unit is not in the idling state.

Further, for example, the heat treatment performed on the wafer in the present invention may be a substrate processing performed in a state where an inner temperature of the heat treatment chamber is 700° C. or less as long as heat is applied to the substrate. The heat treatment performed on the substrate in the present invention may include plasma processing and other processing using heat.

The substrate of the present invention is not limited to the wafer and may be, e.g., a large substrate for use in FPD (Flat Panel Display), or a substrate for use in an EL device or for use in a solar cell.

This application claims priority to Japanese Patent Application No. 2014-191649 filed on Sep. 19, 2014, the entire contents of which are incorporated herein by reference.

DESCRIPTION OF REFERENCE NUMERALS

1: processing system
2: common transfer chamber
6: gate valve
8A, 8B, 8C: load-lock chamber
10: loading transfer chamber
12: inlet port
16: loading transfer unit
16A, 16B: pick (pick of loading transfer chamber)
18: common transfer unit (transfer unit)
18A, 18B: pick (pick of common transfer unit)
38: buffer unit
40: control unit
a, b: susceptor
PM1, PM2: heat treatment chamber

What is claimed is:

1. A substrate transfer method for sequentially transferring a substrate between a heat treatment chamber and another chamber different from the heat treatment chamber by using a transfer unit having a first pick and a second pick, the method comprising:
   a first process of holding an unprocessed substrate by the first pick and transferring the unprocessed substrate to the heat treatment chamber;
   a second process of holding a processed substrate, which has been subjected to heat treatment in the heat treatment chamber, by the second pick, unloading the processed substrate from the heat treatment chamber, and loading the unprocessed substrate held by the first pick into the heat treatment chamber;
   a third process of transferring the processed substrate held by the second pick to said another chamber; and
   a fourth process of holding another unprocessed substrate by the first pick, loading the processed substrate held by the second pick into said another chamber, and then putting both the first pick and the second pick into a state of not holding a substrate,
   wherein in the fourth process, both of the first pick and the second pick are put into the state of not holding a substrate by temporarily mounting the another unprocessed substrate held by the first pick on a buffer unit.

2. The method of claim 1, further comprising, after the fourth process, a fifth process of holding the another unprocessed substrate, by the second pick and switching functions of the first pick and the second pick between holding an unprocessed substrate and holding a processed substrate.

3. The method of claim 1, wherein the fourth process is performed while a substrate is being subjected to the heat treatment in the heat treatment chamber.

4. The method of claim 1, wherein a plurality of substrates is subjected to the heat treatment at the same time in the heat treatment chamber, and
- in the fourth process, both of the first pick and the second pick are put into the state of not holding a substrate after, among the substrates subjected to the heat treatment at the same time, a last processed substrate held by the second pick is loaded into said another chamber.

5. The method of claim 1, wherein the heat treatment chamber is provided in plural number, and
- the fourth process is performed while the heat treatment on substrates is being performed in the respective heat treatment chambers.

6. A processing system for performing heat treatment on a substrate sequentially transferred between a heat treatment chamber and another chamber different from the heat treatment chamber by using the substrate transfer method of claim 1.

* * * * *